US009800438B1

United States Patent
Zhang et al.

(10) Patent No.: US 9,800,438 B1
(45) Date of Patent: Oct. 24, 2017

(54) BUILT-IN EYE SCAN FOR ADC-BASED RECEIVER

(71) Applicant: Xilinx, Inc., San Jose, CA (US)

(72) Inventors: Hongtao Zhang, San Jose, CA (US); Zhaoyin D. Wu, San Jose, CA (US); Christopher J. Borrelli, Los Gatos, CA (US); Geoffrey Zhang, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/333,505

(22) Filed: Oct. 25, 2016

(51) Int. Cl.
*H04L 7/00* (2006.01)
*H04L 25/03* (2006.01)
*H04L 12/26* (2006.01)

(52) U.S. Cl.
CPC .. *H04L 25/03885* (2013.01); *H04L 25/03273* (2013.01); *H04L 43/028* (2013.01)

(58) Field of Classification Search
CPC ..... H04L 7/0337; H04L 7/0334; H04L 7/033; H04L 7/0029; H04L 7/0331; H04L 7/0338; H04L 25/03057; H04L 2025/0349; H04L 2025/03617; H04L 2025/03503; H04L 25/03038; H03L 7/091; H03L 7/0814
USPC ................. 375/229–236, 316–352, 354–376
See application file for complete search history.

(56) References Cited

U.S. PATENT DOCUMENTS

| | | | | |
|---|---|---|---|---|
| 5,970,093 A * | 10/1999 | de Lantremange | ... | H04L 7/0029 375/232 |
| 6,509,773 B2 * | 1/2003 | Buchwald | ............ | H03L 7/0814 327/248 |
| 7,295,644 B1 * | 11/2007 | Wu | ........................ | H03L 7/0807 375/375 |
| 8,050,373 B2 * | 11/2011 | Buchwald | ............ | H04L 7/0091 327/147 |
| 8,396,110 B1 * | 3/2013 | Hsieh | ................ | H04L 25/03038 375/229 |
| 8,650,429 B1 * | 2/2014 | Starr | ................ | H03K 19/01837 713/400 |
| 8,848,774 B2 * | 9/2014 | Zhong | ............... | H04L 25/03038 375/232 |
| 8,855,186 B2 * | 10/2014 | Tan | ................... | H04L 25/03057 375/213 |
| 8,917,803 B1 * | 12/2014 | Asuncion | ................ | H04L 7/033 375/229 |
| 8,923,380 B1 * | 12/2014 | Malhotra | ................. | H04B 1/16 375/232 |

(Continued)

*Primary Examiner* — James M Perez
(74) *Attorney, Agent, or Firm* — Robert M. Brush (57) ABSTRACT

An example method of performing an eye-scan in a receiver includes: generating digital samples from an analog signal input to the receiver based on a sampling clock, the sampling clock phase-shifted with respect to a reference clock based on a phase interpolator (PI) code; equalizing the digital samples based on first equalization parameters of a plurality of equalization parameters of the receiver; adapting the plurality of equalization parameters and performing clock recovery based on the digital samples to generate the PI code; and performing a plurality of cycles of locking the plurality of equalization parameters, suspending phase detection in the clock recovery, offsetting the PI code, collecting an output of the receiver, resuming the phase detection in the clock recovery, and unlocking the equalization parameters to perform the eye scan.

20 Claims, 6 Drawing Sheets

(56) References Cited

U.S. PATENT DOCUMENTS

| | | | | |
|---|---|---|---|---|
| 8,958,504 B2* | 2/2015 | Warke | ............... | H04L 27/0014 375/235 |
| 8,995,514 B1* | 3/2015 | Asuncion | ............... | H04B 3/462 375/226 |
| 9,160,582 B1* | 10/2015 | Huss | ............... | H04L 25/03885 |
| 9,178,552 B1* | 11/2015 | Satarzadeh | ....... | H04L 25/03057 |
| 9,191,245 B2* | 11/2015 | Tan | ............... | H04L 25/03057 |
| 9,237,041 B1* | 1/2016 | An | ............... | H04L 25/03267 |
| 9,325,489 B2* | 4/2016 | Hsieh | ............... | H04L 7/0025 |
| 9,379,880 B1* | 6/2016 | Xu | ............... | H04L 7/0337 |
| 9,397,868 B1* | 7/2016 | Hossain | ............... | H04L 25/03057 |
| 9,432,176 B2* | 8/2016 | Yu | ............... | H04L 7/0025 |
| 9,559,880 B1* | 1/2017 | Cirit | ............... | H04L 25/08 |
| 9,614,557 B1* | 4/2017 | Mayer | ............... | H04B 17/13 |
| 2002/0080898 A1* | 6/2002 | Agazzi | ............... | H03M 1/0624 375/355 |
| 2002/0196889 A1* | 12/2002 | Tamura | ............... | G06F 1/04 375/373 |
| 2005/0207516 A1* | 9/2005 | Tonami | ............... | H04L 25/03038 375/341 |
| 2005/0238126 A1* | 10/2005 | Ribo | ............... | H03L 7/0814 375/355 |
| 2006/0018408 A1* | 1/2006 | Bock | ............... | H04L 7/0062 375/322 |
| 2007/0047680 A1* | 3/2007 | Okamura | ............... | H04L 1/24 375/348 |
| 2007/0201544 A1* | 8/2007 | Zhu | ............... | H04L 25/03057 375/229 |
| 2007/0217558 A1* | 9/2007 | Abel | ............... | H04L 7/0008 375/355 |
| 2010/0085362 A1* | 4/2010 | Tan | ............... | H04L 25/0216 345/440 |
| 2010/0127906 A1* | 5/2010 | Yamaguchi | ............... | H04L 7/0334 341/131 |
| 2010/0177816 A1* | 7/2010 | Malipatil | ............... | H04L 25/03343 375/233 |
| 2010/0329318 A1* | 12/2010 | Dai | ............... | H04L 1/20 375/224 |
| 2010/0329325 A1* | 12/2010 | Mobin | ............... | H04L 25/03343 375/232 |
| 2013/0169328 A1* | 7/2013 | Shibasaki | ............... | H03L 7/0814 327/156 |
| 2014/0286457 A1* | 9/2014 | Chaivipas | ............... | H04L 27/22 375/329 |
| 2015/0180642 A1* | 6/2015 | Hsieh | ............... | H04L 7/0025 375/233 |
| 2017/0005785 A1* | 1/2017 | Aleksic | ............... | H04L 7/033 |

* cited by examiner

FIG. 6

BUILT-IN EYE SCAN FOR ADC-BASED RECEIVER

TECHNICAL FIELD

Examples of the present disclosure generally relate to electronic circuits and, in particular, to a built-in eye scan for an analog-to-digital converter (ADC)-based receiver.

BACKGROUND

In a serializer-deserializer (SerDes) system, it is desirable to have the capability to check the quality of the received and recovered signal. This is useful for determining the system margin and for debugging purposes. A receiver eye scan is an important technique to achieve this purpose. For analog-based SerDes systems, there are typically two approaches for obtain eye scans. The first technique is commonly referred to as a "destructive eye scan." In the destructive eye scan mode, the slicing threshold and sampling phase of the actual data slicer are changed to perform the eye scan. Since the sliced data during the destructive eye scan can be incorrect, this eye scan technique cannot be used for receiving real data traffic. However, the destructive eye scan technique does not require additional hardware.

Another eye scan technique is "non-destructive" in that it can be used while receiving real data traffic without introducing errors. The non-destructive eye scan technique requires one or more extra slicers that are dedicated to the purposes of eye scanning. The dedicated eye scan slicers use different slicing thresholds and sampling phases compared to the slicers in the actual data path. Since the non-destructive eye scan technique does not interrupt normal operation, it can be used even in the asynchronous system where clock data recovery (CDR) is required continuously.

An analog-to-digital converter (ADC)-based SerDes exhibits a performance and cost advantage at higher data rates or for higher loss systems where advanced equalization techniques using digital signal processing become necessary. Time-interleaved ADC is preferred due to the stringent resolution and timing requirements. In such time-interleaved systems, a non-destructive eye scan becomes prohibitively costly due to the number of additional ADCs that are needed for the eye scan function. A destructive eye scan for an ADC-based SerDes has a minimal implementation cost, but it typically is limited to only synchronous systems. Thus, it is desirable to develop a new eye scan technique for ADC-based receivers that is less costly and can be used in both synchronous and asynchronous systems.

SUMMARY

Techniques for providing a programmable reference voltage regulator are described. In an example, a method of performing an eye-scan in a receiver includes: generating digital samples from an analog signal input to the receiver based on a sampling clock, the sampling clock phase-shifted with respect to a reference clock based on a phase interpolator (PI) code; equalizing the digital samples based on first equalization parameters of a plurality of equalization parameters of the receiver; adapting the plurality of equalization parameters and performing clock recovery based on the digital samples to generate the PI code; and performing a plurality of cycles of locking the plurality of equalization parameters, suspending phase detection in the clock recovery, offsetting the PI code, collecting an output of the receiver, resuming the phase detection in the clock recovery, and unlocking the equalization parameters to perform the eye scan.

In another example, a receiver includes a front end configured to receive an analog signal; analog-to-digital converter (ADC) circuitry configured to generate digital samples from the analog signal based on a sampling clock; a digital signal processor (DSP) configured to equalize the digital samples based on first equalization parameters of a plurality of equalization parameters; a clock recovery circuit configured to perform clock recovery based on the digital samples to generate a phase interpolator (PI) code; a PI configured to generate the sampling clock based on the PI code; an adaptation circuit configured to adapt the plurality of equalization parameters; and an eye scan circuit configured to control a plurality of cycles of locking the plurality of equalization parameters, suspending phase detection in the clock recovery of the clock recovery circuit, offsetting the PI code, collecting the digital samples, resuming the phase detection in the clock recovery of the clock recovery circuit, and unlocking the equalization parameters.

In another example, an integrated circuit (IC) includes: a front end configured to receive an analog signal; analog-to-digital converter (ADC) circuitry coupled to the front end; an equalizer coupled to the ADC circuitry; an adaptation circuit coupled to the equalizer; a clock recovery circuit coupled to the equalizer, the clock recovery circuit including a phase detector coupled to a digital loop filter; a phase interpolator (PI) coupled to the clock recovery circuit and the ADC circuitry, the PI receiving a PI code from the digital loop filter; and an eye scan circuit configured to control a plurality of cycles of locking a plurality of equalization parameters, disconnecting the phase detector from the digital loop filter, offsetting the PI code, collecting output of the ADC or the equalizer, reconnecting the phase detector to the digital loop filter, and unlocking the plurality of equalization parameters.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Figure 1:
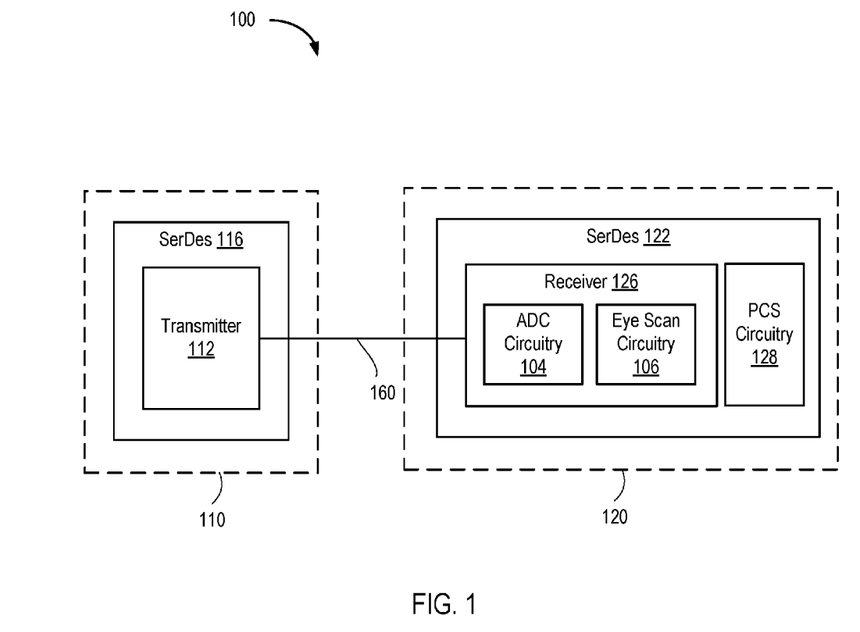
FIG. 1 is a block diagram depicting an example of a serial communication system.

FIG. 1 is a block diagram depicting an example of a serial communication system 100. The serial communication system 100 comprises a transmitter 112 coupled to a receiver 126 over transmission medium 160. The transmitter 112 can be part of a serializer-deserializer (SerDes) 116. The receiver 126 can be part of a SerDes 122. The transmission medium 160 comprises an electrical path between the transmitter 112 and the receiver 126 and can include printed circuit board (PCB) traces, vias, cables, connectors, decoupling capacitors, and the like. The receiver of the SerDes 116, and the transmitter of the SerDes 122, are omitted for clarity. In some examples, the SerDes 116 can be disposed in an integrated circuit (IC) 110, and the SerDes 122 can be disposed in an IC 120.

The transmitter 112 drives serial data onto the transmission medium 160 using a digital baseband modulation technique. In general, the serial data is divided into symbols. The transmitter 112 converts each symbol into an analog voltage mapped to the symbol. The transmitter 112 couples the analog voltage generated from each symbol to the transmission medium 160. In some examples, the transmitter 112 uses a binary non-return-to-zero (NRZ) modulation scheme. In binary NRZ, a symbol is one bit of the serial data and two analog voltages are used to represent each bit. In other examples, the transmitter uses multi-level digital baseband modulation techniques, such as pulse amplitude modulation (PAM), where a symbol includes a plurality of bits of the serial data and more than two analog voltages are used to represent each bit.

The receiver 126 generally includes analog-to-digital converter (ADC) circuitry 104 and eye scan circuitry 106. An example structure of the receiver 126 is described further below with respect to FIG. 2. The receiver 126 receives an analog signal from the transmission medium 160. The ADC circuitry 104 generates a digital signal from the analog signal. As used herein, a digital signal is a sequence of k-bit codes, where k is a positive integer. A k-bit code may be referred to as a digital sample. The number of codes per second is the data rate (also referred to as sample rate). A digital signal can also be conceptually viewed as a discrete-time, discrete-amplitude signal, where the amplitude of the signal at each discrete time is selected from $2^k$ discrete values.

The receiver 126 processes the digital samples output by the ADC circuitry 104 to recover the symbols generated by the transmitter 112. The receiver 126 can provide the recovered symbols to physical coding sublayer (PCS) circuitry 128 in SerDes 122 for decoding and further processing. The eye scan circuitry 106 is configured to control the receiver 126 to perform an eye scan. As described further below, the eye scan circuitry 106 implements a destructive eye scan that can be used in both synchronous and asynchronous systems. The eye scan circuitry 106 controls the receiver 126 to generate eye scan data, which can be transmitted to other circuitry (not shown) for processing (e.g., to check the quality of the received signal). For example, the eye scan data can be transmitted to a computer or the like for visualization of the data eye of the received signal.

Figure 2:
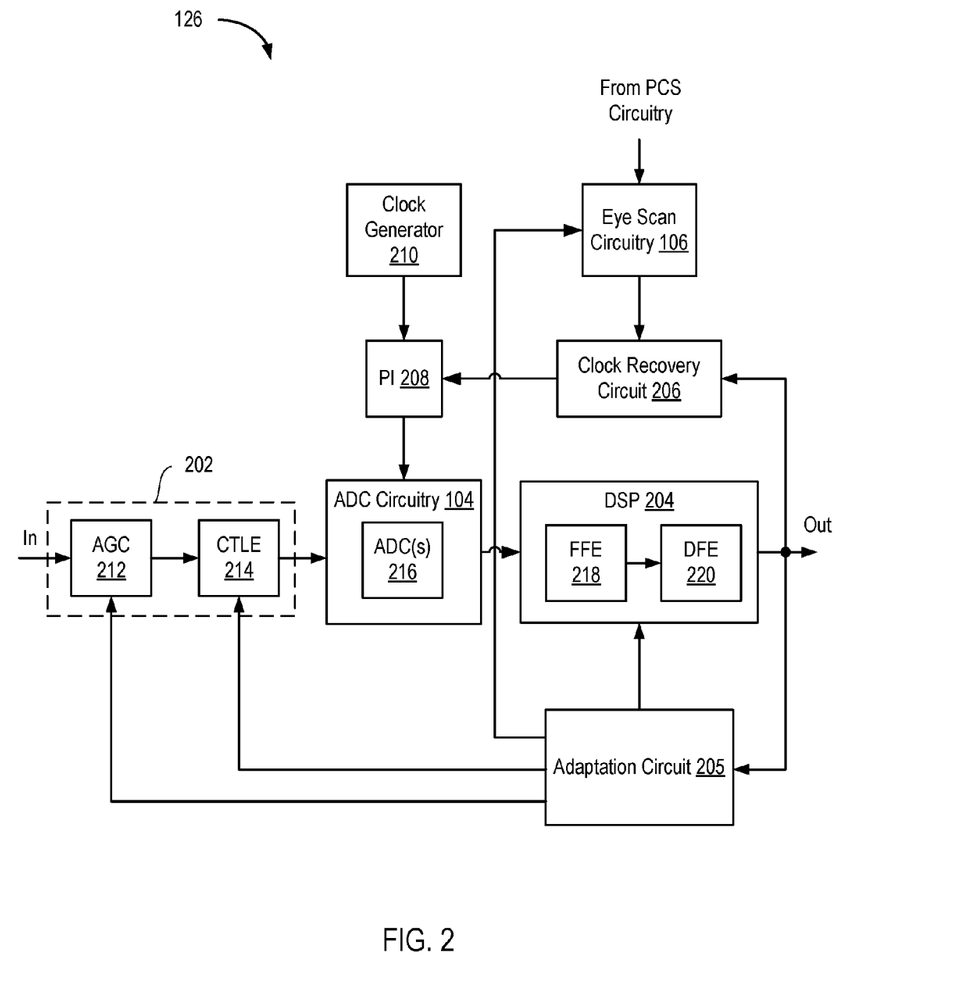
FIG. 2 is a block diagram depicting the receiver according to an example.

FIG. 2 is a block diagram depicting the receiver 126 according to an example. The receiver 126 includes a front end 202, the ADC circuitry 104, a digital signal processor (DSP) 204, an adaptation circuit 205, a clock recovery circuit 206, a phase interpolator (PI) 208, a clock generator 210, and the eye scan circuitry 106. An input of the front end 202 is coupled to the transmission medium 160. An output of the front end 202 is coupled to one input of the ADC circuitry 104. An output of the ADC circuitry 104 is coupled to an input of the DSP 204. An output of the DSP 204 is coupled to an input of the clock recovery circuit 206. An output of the clock recovery circuit 206 is coupled to one input of the PI 208. An output of the clock generator 210 is coupled to another input of the PI 208. An output of the PI 208 is coupled to another input of the ADC circuitry 104.

In operation, the front end 202 receives an analog signal from the transmission medium 160. In an example, the front end 202 includes an automatic gain control (AGC) circuit 212 and a continuous time linear equalizer (CTLE) 214. The AGC circuit 212 adjusts the gain of the analog signal received from the transmission medium 160 based on a gain adjust signal provided by the adaptation circuit 205. The CTLE 214 receives the gain-adjusted analog signal from the AGC circuit 212. The CTLE 214 operates as a high-pass filter to compensate for the low-pass characteristics of the transmission medium 160. The peak of the frequency response of the CTLE 214 can be adjusted based on a CTLE adjust signal provided by the adaptation circuit 205. In another example, the CTLE circuit 214 can precede the AGC circuit 212.

The ADC circuitry 104 receives the analog signal from the front end 202. The ADC circuitry 104 generates a digital signal from the analog signal. The ADC circuitry 104 can include one or more ADCs 216. The ADC circuitry 104 generates digital samples based on a sampling clock output by the PI 208. In an example, the ADC circuitry 104 includes a plurality of the ADCs 216 each operating based on a different phase of the sampling clock (e.g., a time-interleaved ADC circuit).

The DSP 204 receives the digital samples from the ADC circuitry 104. In an example, the DSP 204 includes a feed forward equalizer (FFE) 218 and a decision feedback equalizer (DFE) 220. The FFE 218 applies feed-forward equalization to the digital samples, and DFE 220 applies decision feedback equalization to the digital samples. The FFE 218 and the DFE 220 each include taps that are adjusted by the adaptation circuit 205 using an adaptation algorithm, such as least mean squares (LMS) or the like.

The clock recovery circuit 206 receives the digital samples from the DSP 204. The clock recovery circuit 206 performs a phase detection process to detect a phase error from the digital samples. The clock recovery circuit 206 filters the phase error and generates a PI code for controlling the PI 208. The PI 208 receives a reference clock signal from the clock generator 210 and adjusts the phase of the reference clock signal based on the PI code output by the clock recovery circuit 206. The clock generator 210 can be a phase locked loop (PLL) or the like that provides a reference clock. The PI 208 outputs a sampling clock for the ADC circuitry 104. During data recovery mode, a loop comprising the ADC circuitry 104, the DSP 204, the clock recovery circuit 206, and the PI 208 operates to adjust the sampling clock so that the ADC circuitry 104 samples at or near the center of the data eye.

The eye scan circuitry 106 is coupled to the clock recovery circuit 206. The eye scan circuitry 106 can also be coupled to the adaptation circuit 205 and the PCS circuitry 128. The eye scan circuitry 106 sets the mode of the clock recovery circuit 206 between data recovery and eye scan modes. When in the data recovery mode, the clock recovery circuit 206 operates as described above in order to adjust the sampling clock so that the ADC circuitry 104 samples at or near the center of the data eye to receive the data. When in the eye scan mode, clock recovery circuit 206 operates to adjust the sampling clock so that the ADC circuitry 104 samples at various points across the data eye. During the eye scan mode, the output of the receiver 126 provides eye scan data.

Figure 3:
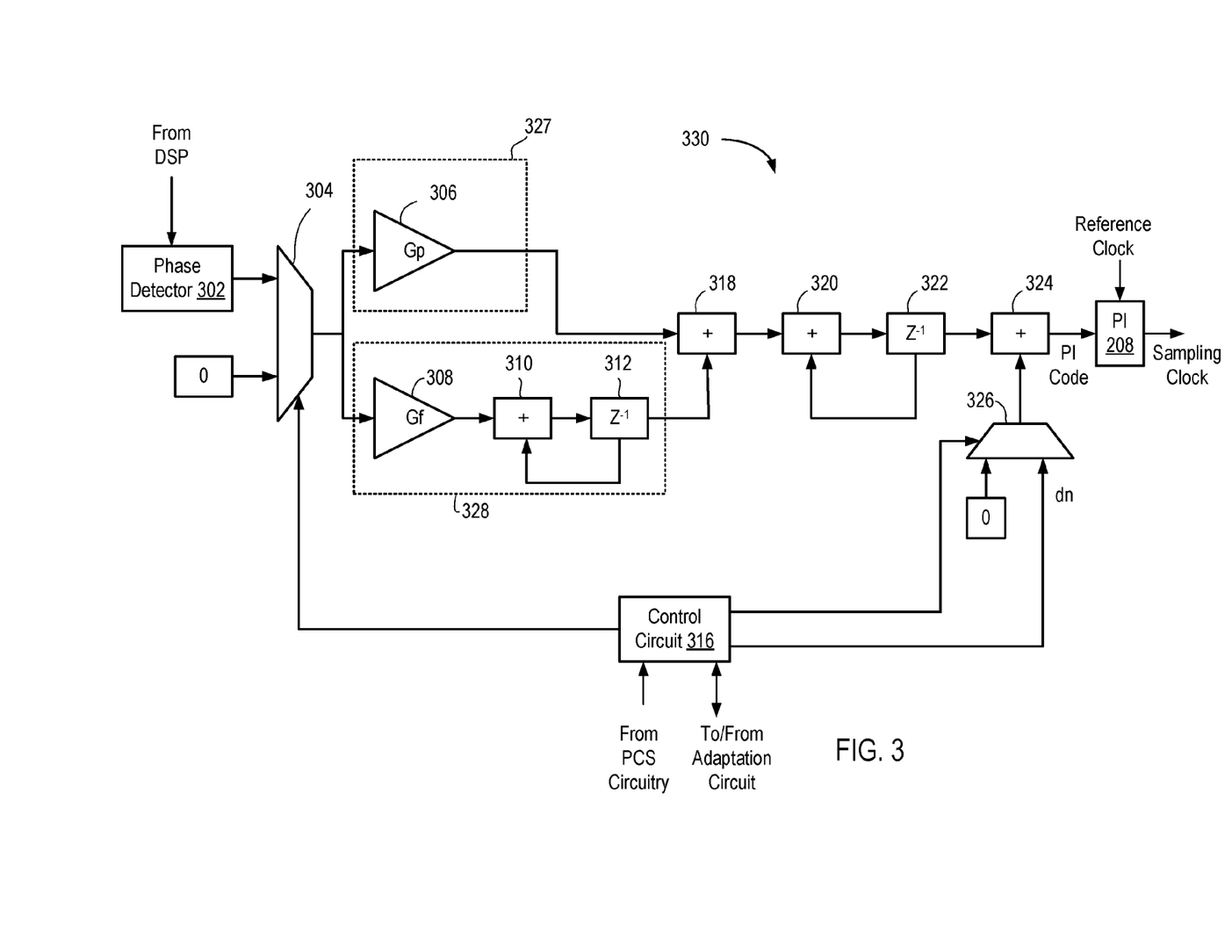
FIG. 3 is a block diagram depicting clock recovery and eye scan circuitry according to an example.

FIG. 3 is a block diagram depicting clock recovery and eye scan circuitry according to an example. The clock recovery circuit 206 includes a phase detector 302 and a digital loop filter 330. The eye scan circuitry 106 includes a control circuit 316, a multiplexer 304, and a multiplexer 326. An input of the phase detector 302 is coupled to the output of the DSP 204. An output of the phase detector 302 is coupled to the digital loop filter 330 through the multiplexer 304. An output of the digital loop filter 330 provides a PI code, which is coupled to the input of the PI 208. The output of the PI 208 provides the sampling clock, as described above.

In an example, the digital loop filter 330 includes a gain circuit 306, a gain circuit 308, an adder 310, a delay element 312, an adder 318, an adder 320, a delay element 322, and an adder 324. The gain circuit 306 implements a phase path 327. The gain circuit 308, the adder 310, and the delay element 312 implement a frequency path 328. Inputs to the gain circuits 306 and 308 are coupled to an output of the multiplexer 304. An output of the gain circuit 306 is coupled to an input of the adder 318. An output of the gain circuit 308 is coupled to an input of the adder 310. An output of the adder 310 is coupled to an input of the delay element 312. An output of the delay element 312 is coupled to another input of the adder 310 and to another input of the adder 318. An output of the adder 318 is coupled to an input of the adder 320. An output of the adder 320 is coupled to an input of the delay element 322. An output of the delay element 322 is coupled to another input of the adder 320 and an input of the adder 324. An output of the adder 324 is coupled to an input of the PI 208. Another input of the adder 324 is coupled to an output of the multiplexer 326. Control inputs of the multiplexers 304, 326 are coupled to outputs of the control circuit 316. An input of the multiplexer 326 is coupled to an output of the control circuit 316. Other inputs of the multiplexers 304 and 326 are coupled to receive a digital zero value.

In operation, the phase detector 302 generates a phase error based on the digital samples output by the DSP 204. The phase error signal is a digital signal. In the data recovery mode, the control circuit 316 controls the multiplexer 304 to couple the output of the phase detector 302 to the phase path 327 and the frequency path 328. The gain circuit 306 applies a phase gain (Gp) to the phase error signal. For example, the gain circuit 306 can implement a left-shift operation to apply the phase gain. The gain circuit 308 applies a frequency gain (Gf) to the phase error signal. For example, the gain circuit 308 can implement a left-shift operation to apply the frequency gain. The output of the gain circuit 308 is integrated by the adder 310 and the delay element 312. The integrated output of the frequency path 328 is added to the output of the phase path 327 by the adder 318. The output of the adder 318 is integrated by the adder 320 and the delay element 322. The integrated output is added to the output of the multiplexer 326 by the adder 324. In the data recovery mode, the control circuit 316 controls the multiplexer 326 to couple a digital zero value to the adder 324. Thus, in the data recovery mode, the output of the delay element 322 is the PI code provided to the PI 208.

In eye scan mode, the control circuit 316 controls the multiplexer 304 to select the digital zero input. Thus, the phase detector 302 is disconnected from the phase path 327 and the frequency path 328 and phase detection is suspended. Further, the control circuit 316 controls the multiplexer 326 to select a PI code offset (dn) rather than the digital zero value. The PI code offset is generated by the control circuit 316. In the eye scan mode, the adder 324 adds the PI code offset to the output of the delay element 322 to generate the PI code for the PI 208. In this manner, the control circuit 316 can offset the PI code generated by the digital loop filter 330 by different amounts during each cycle of the eye scan mode. The control circuit 316 can select the eye scan mode based on data from the adaptation circuit 205 and/or PCS circuitry 128, as discussed further below. The control circuit 316 can also output a control signal to the adaptation circuit 205, as discussed further below.

Figure 4:
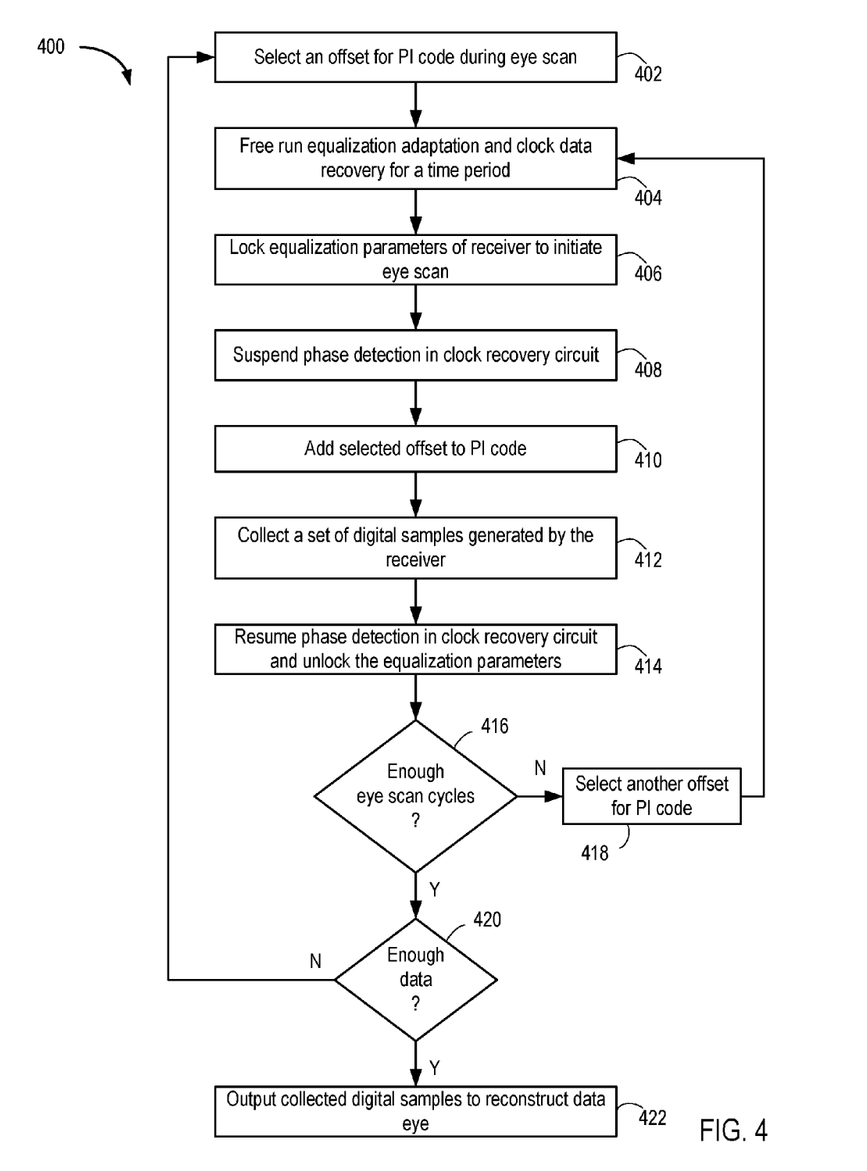
FIG. 4 is a flow diagram depicting a method of performing an eye scan in a receiver according to an example.

FIG. 4 is a flow diagram depicting a method 400 of performing an eye scan in a receiver according to an example. The method 400 can be performed by the SerDes 122 described above. The method 400 begins at step 402, where the control circuit 316 selects an initial offset for the PI code to be used during the eye scan mode (e.g., the control circuit 316 selects value for dn).

At step 404, the control circuit 316 implements the data recovery mode, where equalization adaptation and clock data recovery are free run for a time period. In an example, the data recovery mode is implemented until the error in the recovered data is below a threshold value and/or until the equalization parameters have settled to within threshold values. The equalization parameters include the taps of the FFE 218 and the DFE 220. The equalization parameters can also include the AGC and CTLE adjust parameters. The equalization parameters are adjusted by the adaptation circuit 205, as described above. The control circuit 316 can monitor the equalization parameters or can receive a signal from the adaptation circuit 205 that indicates whether the equalization parameters have settled to within threshold values. The control circuit 316 can also receive a signal from the PCS circuitry 128 indicating that the error in the recovered data is below a threshold.

At step 406, the control circuit 316 controls the adaptation circuit 205 to lock the equalization parameters and initiates the eye scan mode. At step 408, the control circuit 316 suspends phase detection in the clock recovery circuit 206. In particular, the control circuit 316 controls the multiplexer 304 to disconnect the phase detector 302 from the phase path 327 and the frequency path 328 of the digital loop filter 330. The digital loop filter 330 continues to update the PI code according to the integration paths therein. Thus, the clock recovery circuit 206 still tracks the DC frequency offset between the receiver 126 and the transmitter 112 during the eye scan mode.

At step 410, the control circuit 316 adds the selected offset to the PI code. In particular, the control circuit 316 controls the multiplexer 326 to select the PI code offset dn, which is added to the output of the digital loop filter 330. At step 412, PCS circuitry 128 collects a set of digital samples generated by the receiver 126 during the eye scan mode. The control circuit 316 can implement the eye scan mode for a duration of x samples. In an example, the duration x is chosen such that during this time, the phase drift is smaller than the eye scan step size (dp). This can be guaranteed as long as the residual frequency offset (rfo) times x is less than dp, i.e., rfo*x<dp, which equates to x<dp/rfo.

At step 414, the control circuit 316 resumes phase detection in the clock recovery circuit 206 and unlocks the equalization parameters. In particular, the control circuit 316 controls the multiplexer 304 to select the output of the phase detector 302, and controls the multiplexer 326 to select the digital zero input so that the PI code output by the digital loop filter 330 is not offset. The control circuit 316 signals the adaptation circuit to unlock the equalization parameters and resume the adaptation process.

At step 416, the control circuit 316 determines whether there have been enough eye scan cycles. The control circuit 316 can implement the eye scan mode with different PI code offsets to cover an entire unit interval (UI) or a predefined number of UIs. If more eye scan cycles are needed, the method 400 proceeds to step 418, where the control circuit 316 selects another offset for the PI code. The method 400 returns to step 404 and repeats. If no more eye scan cycles are needed, the method 400 proceeds to step 420.

At step 420, the PCS circuitry 128 determines whether enough eye scan data has been received. If so, the method 400 proceeds to step 422, where the digital samples collected during the eye scan cycles are output to reconstruct the data eye. If there are not enough digital samples to statistically reconstruct the eye, method 400 can return to step 402 and repeat.

In an example, at step 412, the PCS circuitry 128 collects equalized digital samples output by the DSP 204 during the eye scan cycles. In another example, at step 412, the PCS circuitry 128 collects digital samples output by the ADC circuitry 104. The digital samples received from the ADC circuitry 104 during the eye scan cycles can be post-processed using the locked equalization parameter values to obtain the eye scan data.

Figure 5:
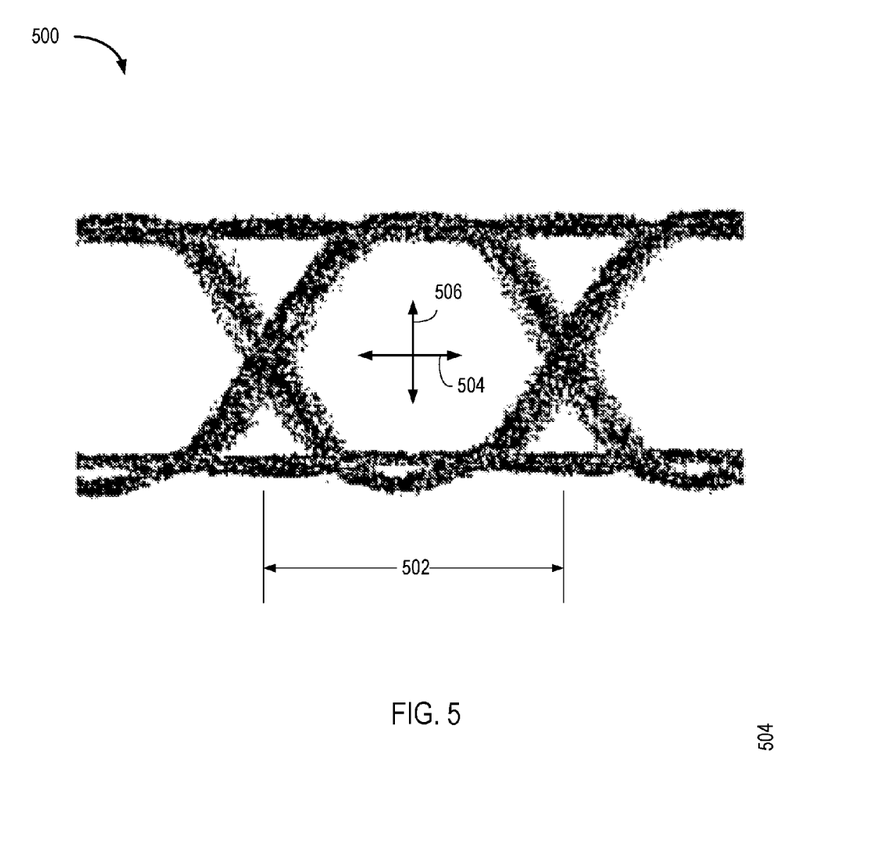
FIG. 5 illustrates an example eye plot for a binary non-return-to-zero (NRZ) signal.

FIG. 5 illustrates an example eye plot 500 for a binary NRZ signal. The eye plot 500 is formed from the various digital samples collected during the eye scan cycles described above. The eye plot 500 shows the data eye for a UI 502. During each eye scan cycle, the PI code is offset to scan across an axis 504 representing time. An axis 506 represents amplitude. Since the receiver is ADC-based, the collected digital samples can include enough resolution that no scanning is necessary across the axis 504. While the example shows a binary NRZ signal, eye plots for multi-level PAM signals and the like can also be formed using the techniques described above.

Figure 6:
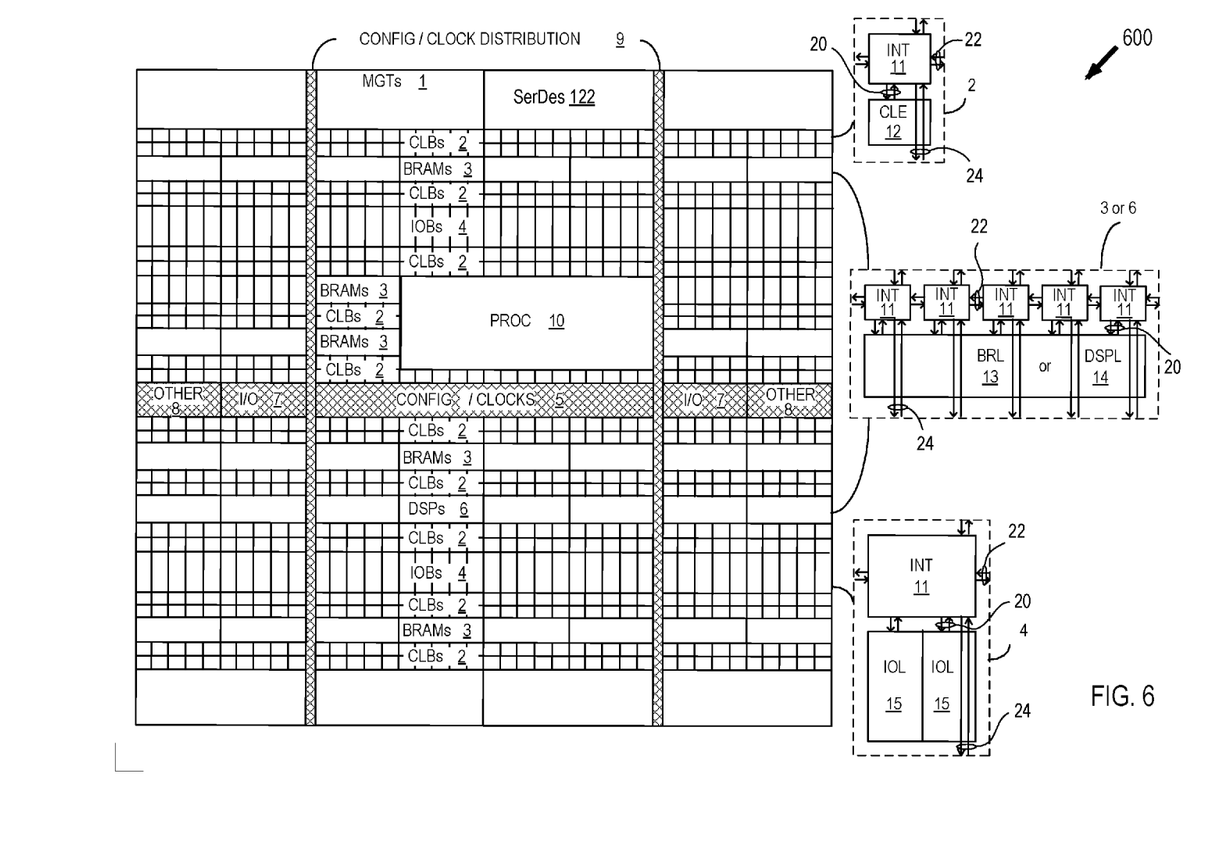
FIG. 6 illustrates an architecture of a field programmable gate array (FPGA) in which examples of the serializer-deserializer described herein can be employed.

The SerDes 122 described above can be implemented within an integrated circuit, such as a field programmable gate array (FPGA) or like type programmable circuit. FIG. 6 illustrates an architecture of FPGA 600 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10. FPGA 600 can include one or more instances of SerDes 122 described above.

In some FPGAs, each programmable tile can include at least one programmable interconnect element ("INT") 11 having connections to input and output terminals 20 of a programmable logic element within the same tile, as shown by examples included at the top of FIG. 1. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An IOB 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 11) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A method of performing an eye-scan in a receiver, comprising:
generating digital samples from an analog signal input to the receiver based on a sampling clock, the sampling clock phase-shifted with respect to a reference clock based on a phase interpolator (PI) code;
equalizing the digital samples based on first equalization parameters of a plurality of equalization parameters of the receiver;
adapting the plurality of equalization parameters and performing clock recovery based on the digital samples to generate the PI code;
performing a plurality of cycles of locking the plurality of equalization parameters, suspending phase detection in the clock recovery, offsetting the PI code, collecting an output of the receiver, resuming the phase detection in the clock recovery, and unlocking the equalization parameters to perform the eye scan.

2. The method of claim 1, wherein the step of performing the clock recovery comprises:
performing the phase detection based on the digital samples to generate a phase error signal;
filtering the phase error signal through a digital loop filter to generate the PI code.

3. The method of claim 2, wherein the step of suspending the phase detection comprises:
disconnecting an output of a phase detector configured to perform the phase detection from an input of the digital loop filter.

4. The method of claim 2, wherein the step of offsetting the PI code comprises:
adding a selected amount to the output of the digital loop filter to generate the PI code.

5. The method of claim 4, wherein the selected amount is varied over the plurality of cycles.

6. The method of claim 1, wherein the output of the receiver collected during the plurality of cycles is obtained from the equalized digital samples.

7. The method of claim 1, wherein the output of the receiver collected during the plurality of cycles is obtained from the digital samples generated prior to equalization thereof.

8. The method of claim 1, wherein the plurality of cycles are performed until the PI code has been updated to cover at least one unit interval (UI) of the analog signal.

9. A receiver, comprising:
a front end configured to receive an analog signal;
analog-to-digital converter (ADC) circuitry configured to generate digital samples from the analog signal based on a sampling clock;
a digital signal processor (DSP) configured to equalize the digital samples based on first equalization parameters of a plurality of equalization parameters;
a clock recovery circuit configured to perform clock recovery based on the digital samples to generate a phase interpolator (PI) code;
a PI configured to generate the sampling clock based on the PI code; an adaptation circuit configured to adapt the plurality of equalization parameters; and
an eye scan circuit configured to control a plurality of cycles of locking the plurality of equalization parameters, suspending phase detection in the clock recovery of the clock recovery circuit, offsetting the PI code, collecting the digital samples, resuming the phase detection in the clock recovery of the clock recovery circuit, and unlocking the equalization parameters.

10. The receiver of claim 9, wherein the clock recovery circuit comprises:
a phase detector configured to perform the phase detection based on the digital samples to generate a phase error signal; and
a digital loop filter configured to filter the phase error signal to generate the PI code.

11. The receiver of claim 10, wherein the eye scan circuit is configured to suspend the phase detection by disconnecting an output of the phase detector from an input of the digital loop filter.

12. The receiver of claim 10, wherein the eye scan circuit is configured to offset the PI code by adding a selected amount to the output of the digital loop filter to generate the PI code.

13. The receiver of claim 12, wherein the selected amount is varied over the plurality of cycles.

14. The receiver of claim 9, wherein the digital samples collected during the plurality of cycles are obtained from the equalizer.

15. The receiver of claim 9, wherein the digital samples collected during the plurality of cycles are obtained from the ADC circuitry.

16. The receiver of claim 9, wherein the eye scan circuit is configured to perform the plurality of cycles until the PI code has been updated to cover at least one unit interval (UI) of the analog signal.

17. An integrated circuit (IC), comprising:
a front end configured to receive an analog signal; analog-to-digital converter (ADC) circuitry coupled to the front end; an equalizer coupled to the ADC circuitry; an adaptation circuit coupled to the equalizer;
a clock recovery circuit coupled to the equalizer, the clock recovery circuit including a phase detector coupled to a digital loop filter;
a phase interpolator (PI) coupled to the clock recovery circuit and the ADC circuitry, the PI receiving a PI code from the digital loop filter; and
an eye scan circuit configured to control a plurality of cycles of locking a plurality of equalization parameters, disconnecting the phase detector from the digital loop filter, offsetting the PI code, collecting output of the ADC or the equalizer, reconnecting the phase detector to the digital loop filter, and unlocking the plurality of equalization parameters.

18. The IC of claim 17, wherein the eye scan circuit is configured to offset the PI code by adding a selected amount to an output of the digital loop filter to generate the PI code.

19. The IC of claim 18, wherein the selected amount is varied over the plurality of cycles.

20. The IC of claim 17, wherein the plurality of cycles are performed until the PI code has been updated to cover at least one unit interval (UI) of the analog signal.

* * * * *